(12) United States Patent
Chanemougame et al.

(10) Patent No.: US 11,069,744 B2
(45) Date of Patent: Jul. 20, 2021

(54) STEEP-SWITCH VERTICAL FIELD EFFECT TRANSISTOR

(71) Applicant: International Business Machines Corporation, Armonk, NY (US)

(72) Inventors: Daniel Chanemougame, Albany, NY (US); Julien Frougier, Albany, NY (US); Nicolas J. Loubet, Guilderland, NY (US); Ruilong Xie, Schenectady, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/668,116

(22) Filed: Oct. 30, 2019

(65) Prior Publication Data

US 2020/0091237 A1     Mar. 19, 2020

Related U.S. Application Data

(62) Division of application No. 15/729,758, filed on Oct. 11, 2017, now Pat. No. 10,541,272.

(51) Int. Cl.
*H01L 47/00* (2006.01)
*H01L 27/24* (2006.01)
(Continued)

(52) U.S. Cl.
CPC ...... *H01L 27/2454* (2013.01); *H01L 29/0847* (2013.01); *H01L 29/1037* (2013.01);
(Continued)

(58) Field of Classification Search
CPC ............. H01L 27/2454; H01L 29/0847; H01L 29/1037; H01L 29/6656; H01L 29/66666;
(Continued)

(56) References Cited

U.S. PATENT DOCUMENTS 5,293,053 A    3/1994 Malhi et al.
7,241,655 B2   7/2007 Tang et al.
(Continued)

OTHER PUBLICATIONS

Becker et al. "Femtosecond Laser Excitation of the Semiconductor-Metal Phase Transition in VO2", Appl. Phys. Lett.,. vol. 65, No. 12, Sep. 1994, pp. 1507-1509.
(Continued)

*Primary Examiner* — Victor A Mandala
*Assistant Examiner* — Colleen E Snow
(74) *Attorney, Agent, or Firm* — Cantor Colburn LLP; Joseph Petrokaitis

(57) ABSTRACT

Embodiments of the invention are directed to a method and resulting structures for a steep-switch vertical field effect transistor (SS-VFET). In a non-limiting embodiment of the invention, a semiconductor fin is formed vertically extending from a bottom source or drain region of a substrate. A top source or drain region is formed on a surface of the semiconductor fin and a top metallization layer is formed on the top source or drain region. A bi-stable resistive system is formed on the top metallization layer. The bi-stable resistive system includes an insulator-to-metal transition material or a threshold-switching selector. The SS-VFET provides a subthreshold switching slope of less than 60 millivolts per decade.

8 Claims, 17 Drawing Sheets

(51) Int. Cl.
*H01L 29/10* (2006.01)
*H01L 29/66* (2006.01)
*H01L 29/08* (2006.01)
*H01L 45/00* (2006.01)
*H01L 29/78* (2006.01)
*H01L 27/22* (2006.01)

(52) U.S. Cl.
CPC .... *H01L 29/6656* (2013.01); *H01L 29/66666* (2013.01); *H01L 29/7827* (2013.01); *H01L 45/1233* (2013.01); *H01L 45/1608* (2013.01); H01L 27/228 (2013.01); *H01L 45/14* (2013.01); *H01L 45/142* (2013.01); *H01L 45/146* (2013.01); *H01L 45/147* (2013.01)

(58) Field of Classification Search
CPC ............. H01L 29/7827; H01L 45/1233; H01L 45/1608; H01L 27/228; H01L 45/14; H01L 45/142; H01L 45/146; H01L 45/147
See application file for complete search history.

(56) References Cited

U.S. PATENT DOCUMENTS

| | | | |
|---|---|---|---|
| 7,372,091 | B2 | 5/2008 | Leslie |
| 7,932,167 | B2 | 4/2011 | Furukawa et al. |
| 8,896,035 | B2 | 11/2014 | Murali et al. |
| 9,024,290 | B2 | 5/2015 | Liu |
| 9,419,115 | B2 | 8/2016 | Bajaj et al. |
| 9,455,343 | B2 | 9/2016 | Pillarisetty et al. |
| 9,508,429 | B2 | 11/2016 | Choi |
| 9,613,867 | B2 | 4/2017 | Bajaj et al. |
| 2014/0110765 | A1 | 4/2014 | Murali et al. |
| 2015/0091067 | A1 | 4/2015 | Pillarisetty et al. |
| 2016/0365426 | A1 | 12/2016 | Ching et al. |
| 2019/0109177 | A1 | 4/2019 | Chanemougame et al. |

OTHER PUBLICATIONS

Chudnovskiy et al. "Switching device based on firstorder metal-insulator transition induced by external electric field," in Future Trends in Microelectronics: The Nano Millennium, ed. by S. Luryi, J. M. Xu, and A. Zaslavsky, Wiley Interscience, New York (2002), pp. 148-155.

Frougier et al. "Phase-transition-FET exhibiting steep switching slope of 8mV/decade and 36% enhanced on current," IEEE 2016 Symposium on VLSI Technology Digest of Technical Papers, 2016, 2 pages.

Lim et al. "Excellent threshold switching device (IOFF ~ 1 pA) with atom-scale metal filament for steep slope (< 5 mV/dec), ultra low voltage (VDD = 0.25 V) FET applications", Presented at IEDM (2016), 4 pages.

List of IBM Patents or Patent Applications Treated as Related; (Appendix P), Date Filed Oct. 30, 2019; 2 pages.

Shukla et al. "A steep-slope transistor based on abrupt electronic phase transition," Nature Communication, 6:7812, DOI: 10.1038/ncomms8812, (2015), 6 pages.

Shukla et al. "Ag/HfO2 based threshold switch with extreme non-linearity for unipolar cross-point memory and steep-slope phase-FETs," 2016 IEEE International Electron Devices Meeting (IEDM), San Francisco, CA, 2016, 4 pages.

Song et al. "Monolithic Integration of AgTe/TiO2 based Threshold Switching Device with TiN liner for Steep Slope Field-Effect Transistors", Presented at IEDM (2016), 4 pages.

Song et al. "Steep Slope Field-Effect Transistors With Ag/TiO2-Based Threshold Switching Device," in IEEE Electron Device Letters, vol. 37, No. 7, Jul. 2016, 4 pages.

Tomioka et al. "Integration of III-V nanowires on Si: From high-performance vertical FET to steep-slope switch," International Electron Devices Meeting (IEDM), 2013, 4 pages.

Verma et al. "Demonstration of GaN HyperFETs with ALD VO2," 74th Annual Device Research Conference (DRC), 2016, 2 pages.

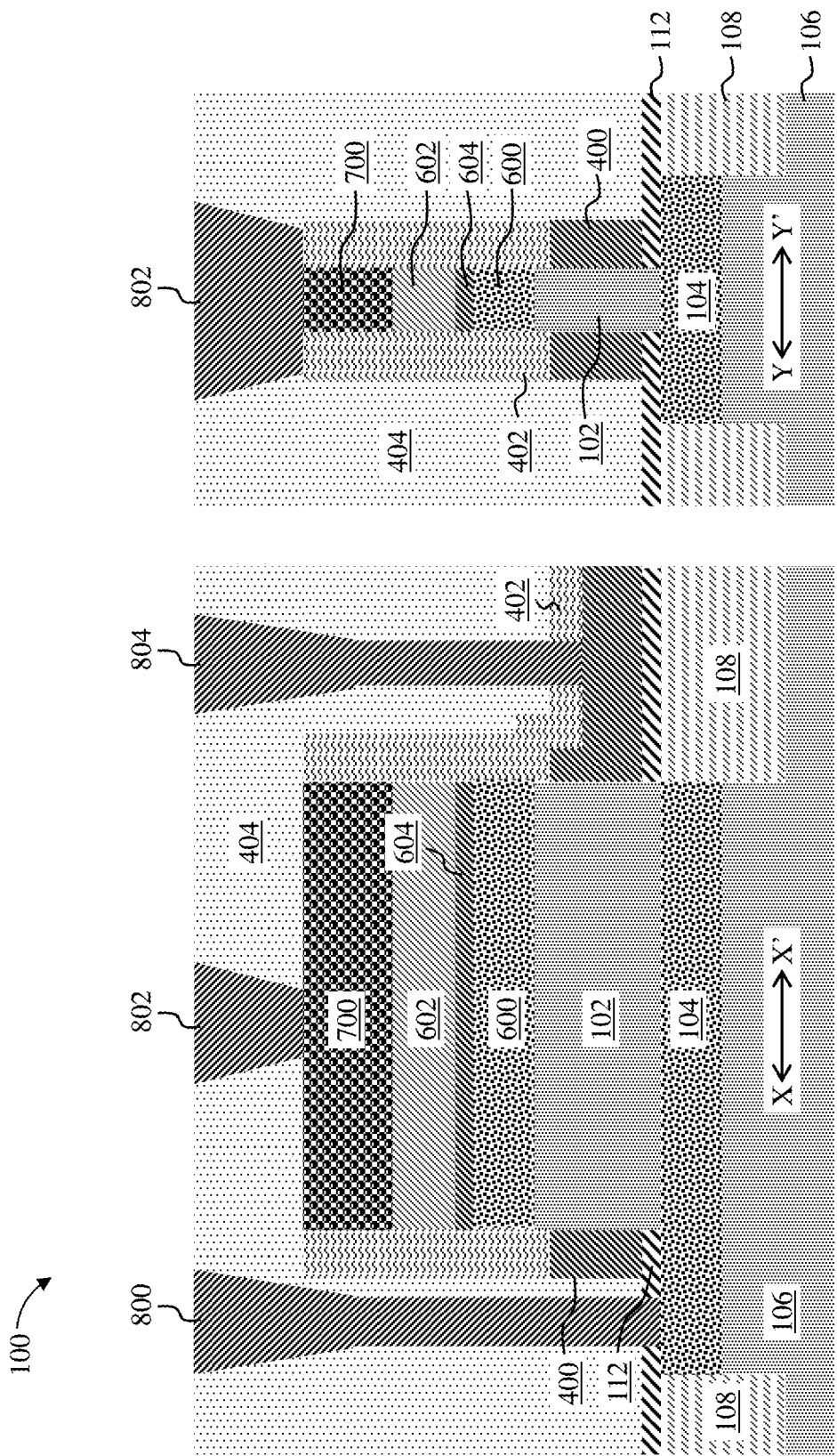

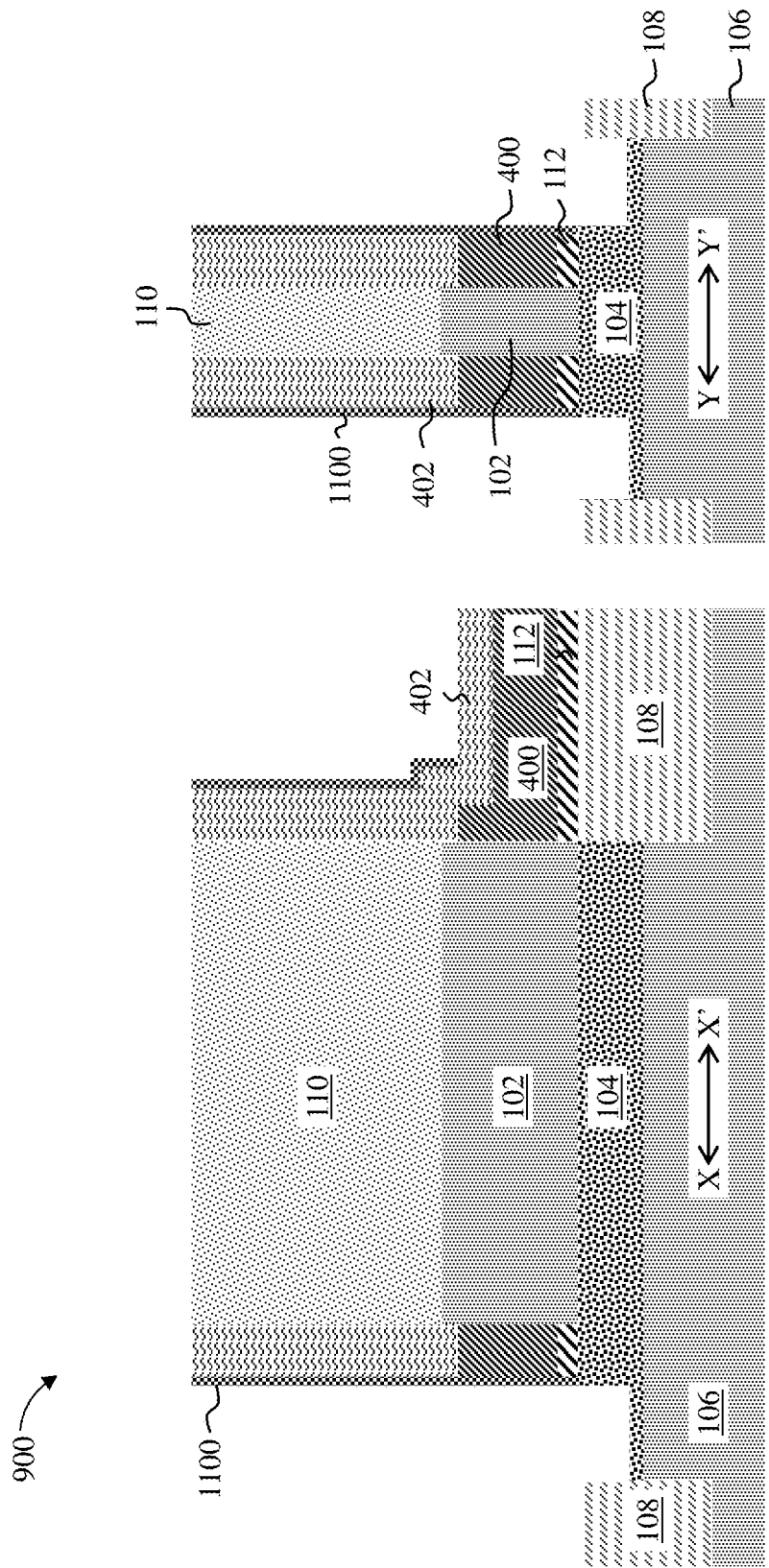

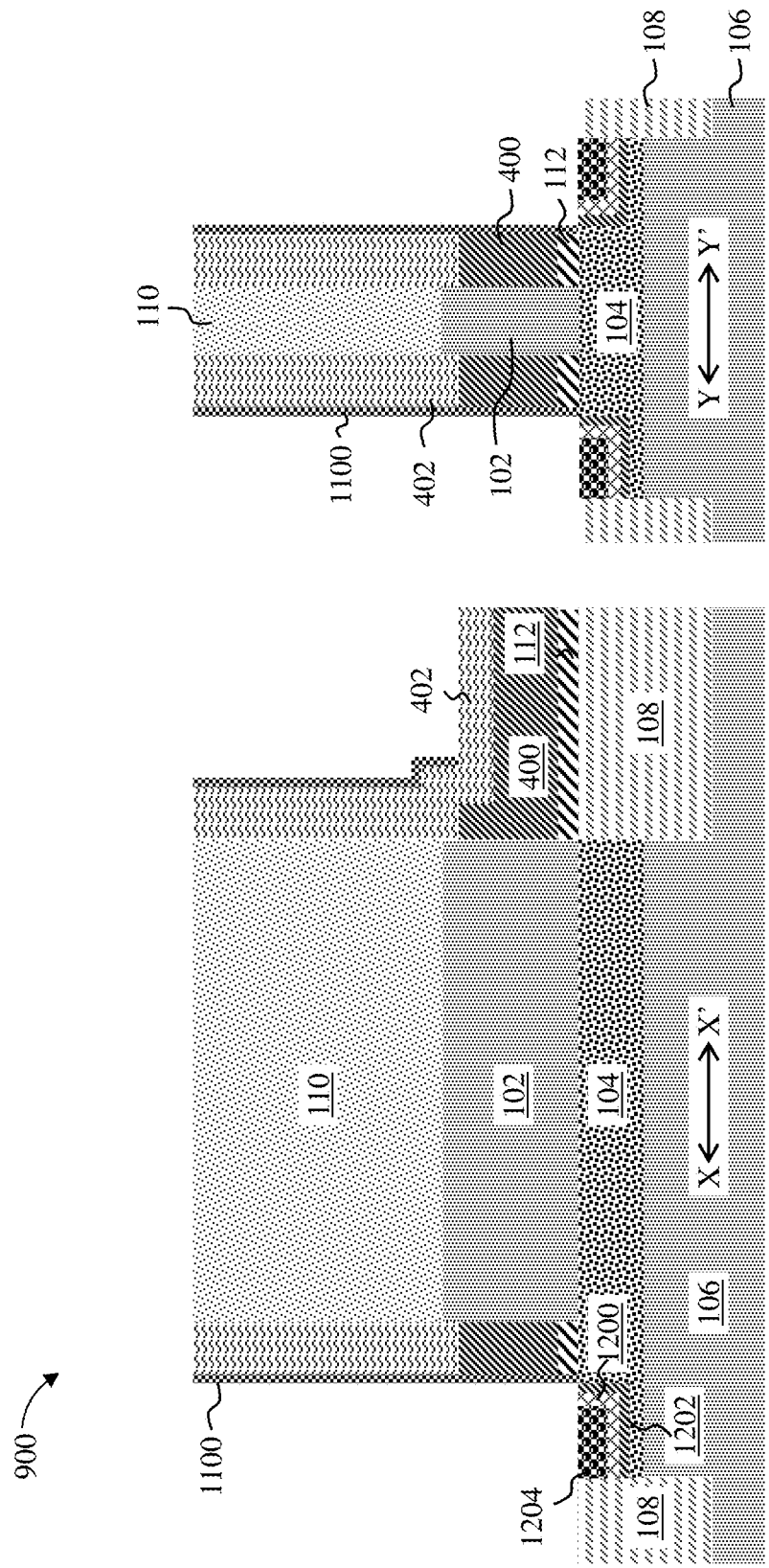

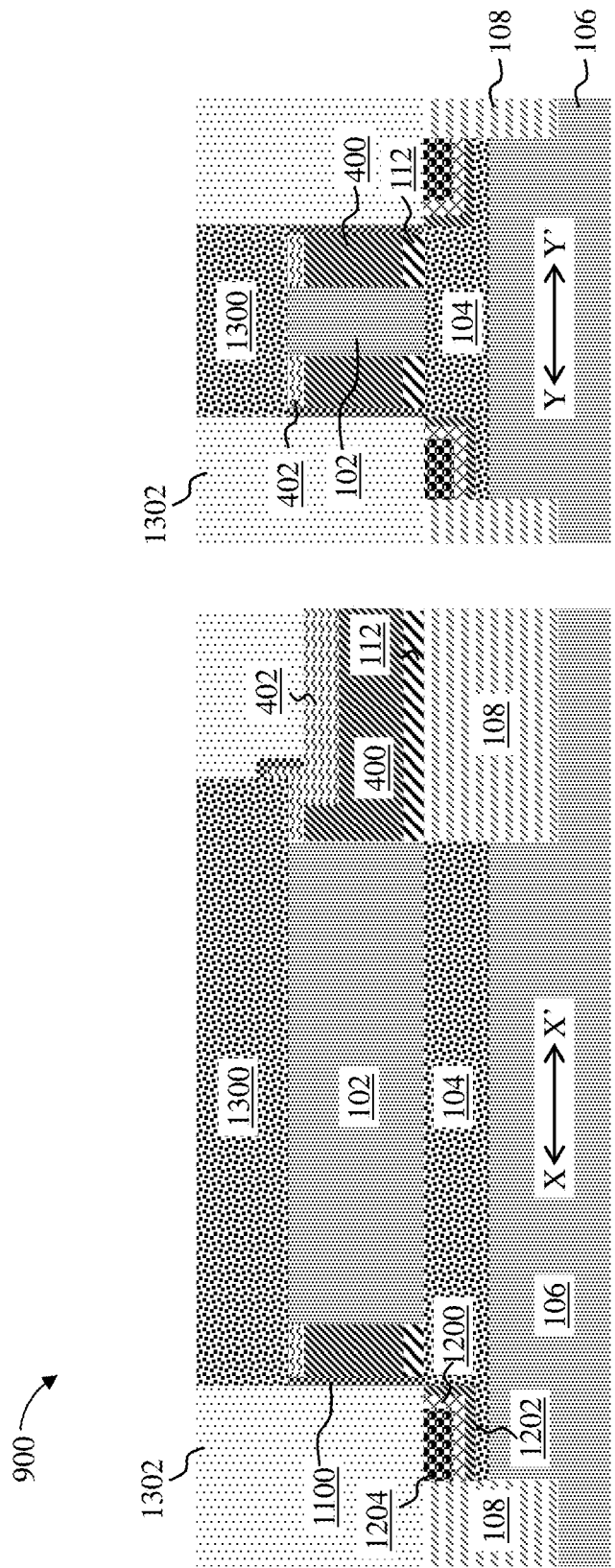

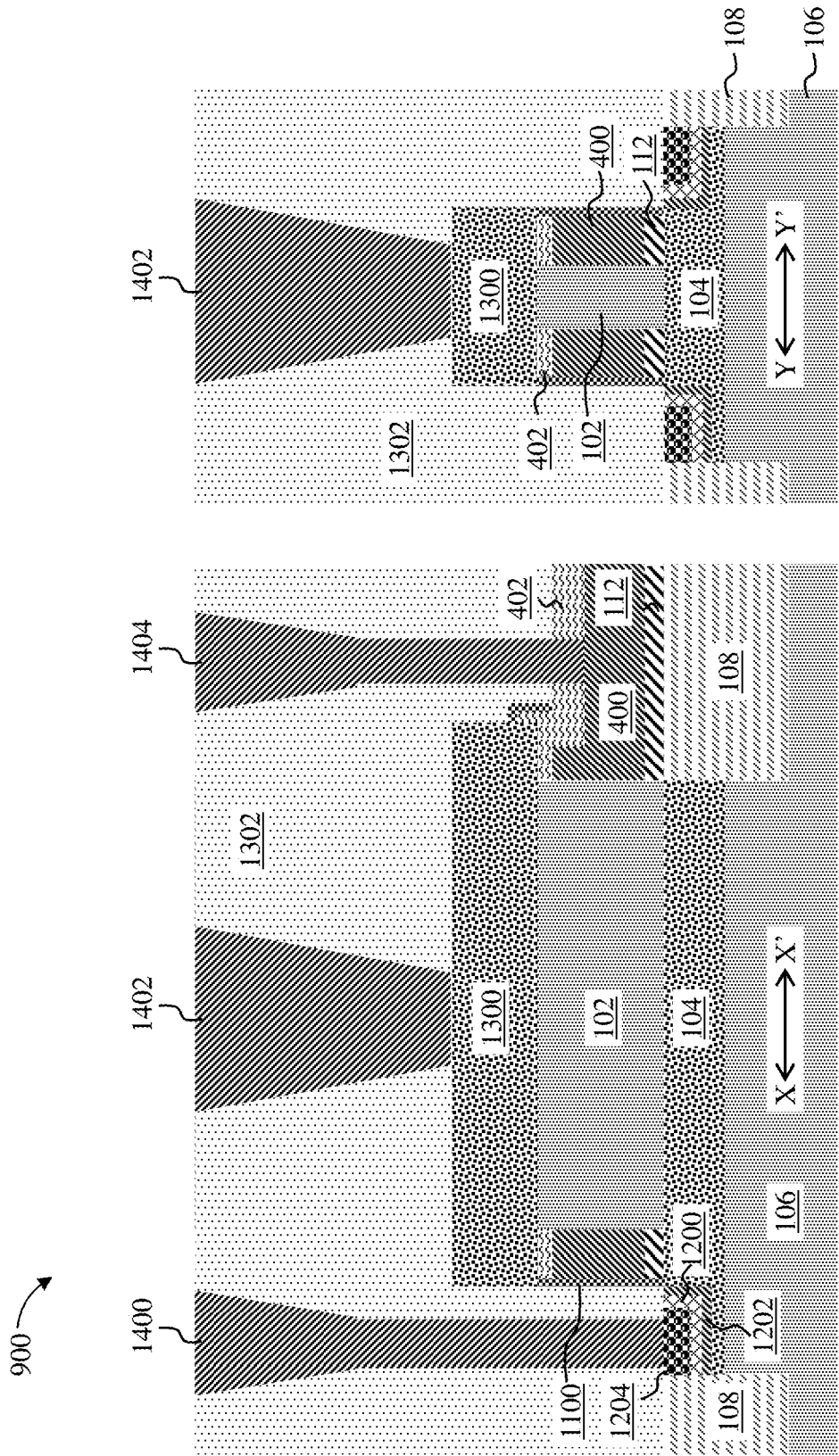

STEEP-SWITCH VERTICAL FIELD EFFECT TRANSISTOR

DOMESTIC PRIORITY

This application is a divisional of U.S. application Ser. No. 15/729,758, titled "STEEP-SWITCH VERTICAL FIELD EFFECT TRANSISTOR" filed Oct. 11, 2017, the contents of which are incorporated by reference herein in its entirety.

BACKGROUND

The present invention generally relates to fabrication methods and resulting structures for semiconductor devices. More specifically, the present invention relates to a novel design for a "Steep-Switch" Vertical Field Effect Transistor (SS-VFET).

Traditional CMOS (Complementary Metal Oxide Semiconductor) fabrication techniques include process flows for constructing planar transistors. With planar transistors, transistor density can be increased by decreasing the pitch between transistor gate elements. However, with planar transistors, the ability to decrease gate pitch is limited by the required gate length and spacer thickness. In recent years, there has been significant research and development with regard to nonplanar transistor architectures. Some nonplanar transistor architectures, such as Vertical Field Effect Transistors (VFETs), employ semiconductor fins and sidegates that can be contacted outside the active region, resulting in increased device density and some increased performance over lateral devices. In VFETs the source to drain current flows in a direction that is perpendicular to a major surface of the substrate. For example, in a known VFET configuration a major substrate surface is horizontal and a vertical fin or nanowire extends upward from the substrate surface. The fin or nanowire forms the channel region of the transistor. A source region and a drain region are situated in electrical contact with the top and bottom ends of the channel region, while the gate is disposed on one or more of the fin or nanowire sidewalls.

SUMMARY

Embodiments of the present invention are directed to a method for fabricating a Steep-Switch Vertical Field Effect Transistor (SS-VFET). A non-limiting example of the method includes forming a semiconductor fin vertically extending from a bottom source or drain region of a substrate. A top source or drain region is formed on a surface of the semiconductor fin and a top metallization layer is formed on the top source or drain region. A Bi-stable Resistive System (BRS) is formed on the top metallization layer. The BRS includes an insulator-to-metal transition material or a threshold-switching selector. The SS-VFET exhibits a subthreshold switching slope of less than the fundamental Boltzmann limit of 60 millivolts per decade at room temperature by harnessing the abrupt resistance switch of the BRS integrated in series with the source of the VFET.

Embodiments of the present invention are directed to a method for fabricating a SS-VFET. A non-limiting example of the method includes forming a semiconductor fin vertically extending from a bottom source or drain region of a substrate. A portion of the bottom source or drain region is recessed and a bottom metallization layer is formed within the recess. A BRS is formed on the bottom metallization layer. The BRS includes an insulator-to-metal transition material or a threshold-switching selector. The SS-VFET exhibits a subthreshold switching slope of less than the fundamental Boltzmann limit of 60 millivolts per decade by harnessing the abrupt resistance switch of the BRS integrated in series with the source of the VFET.

Embodiments of the invention are directed to a SS-VFET. A non-limiting example of the semiconductor device includes a semiconductor fin vertically extending from a bottom source or drain region of a substrate and a conductive gate formed over a channel region of the semiconductor fin. A top source or drain region is formed on a surface of the semiconductor fin and a top metallization layer is formed on the top source or drain region. A first BRS is formed on the top metallization layer. The BRS includes an insulator-to-metal transition material or a threshold-switching selector. The SS-VFET exhibits a subthreshold switching slope of less than the fundamental Boltzmann limit of 60 millivolts per decade by harnessing the abrupt resistance switch of the BRS integrated in series with the source of the VFET.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIGS. 8A and 8B depict the cross-sectional views of the semiconductor structure along the lines X-X' and Y-Y' after a processing operation according to one or more embodiments of the invention;

FIGS. 11A and 11B depict the cross-sectional views of the semiconductor structure along the lines X-X' and Y-Y' after a processing operation according to one or more embodiments of the invention;

FIGS. 12A and 12B depict the cross-sectional views of the semiconductor structure along the lines X-X' and Y-Y' after a processing operation according to one or more embodiments of the invention;

FIGS. 13A and 13B depict the cross-sectional views of the semiconductor structure along the lines X-X' and Y-Y' after a processing operation according to one or more embodiments of the invention;

FIGS. 14A and 14B depict the cross-sectional views of the semiconductor structure along the lines X-X' and Y-Y' after a processing operation according to one or more embodiments of the invention;

Figure 1:
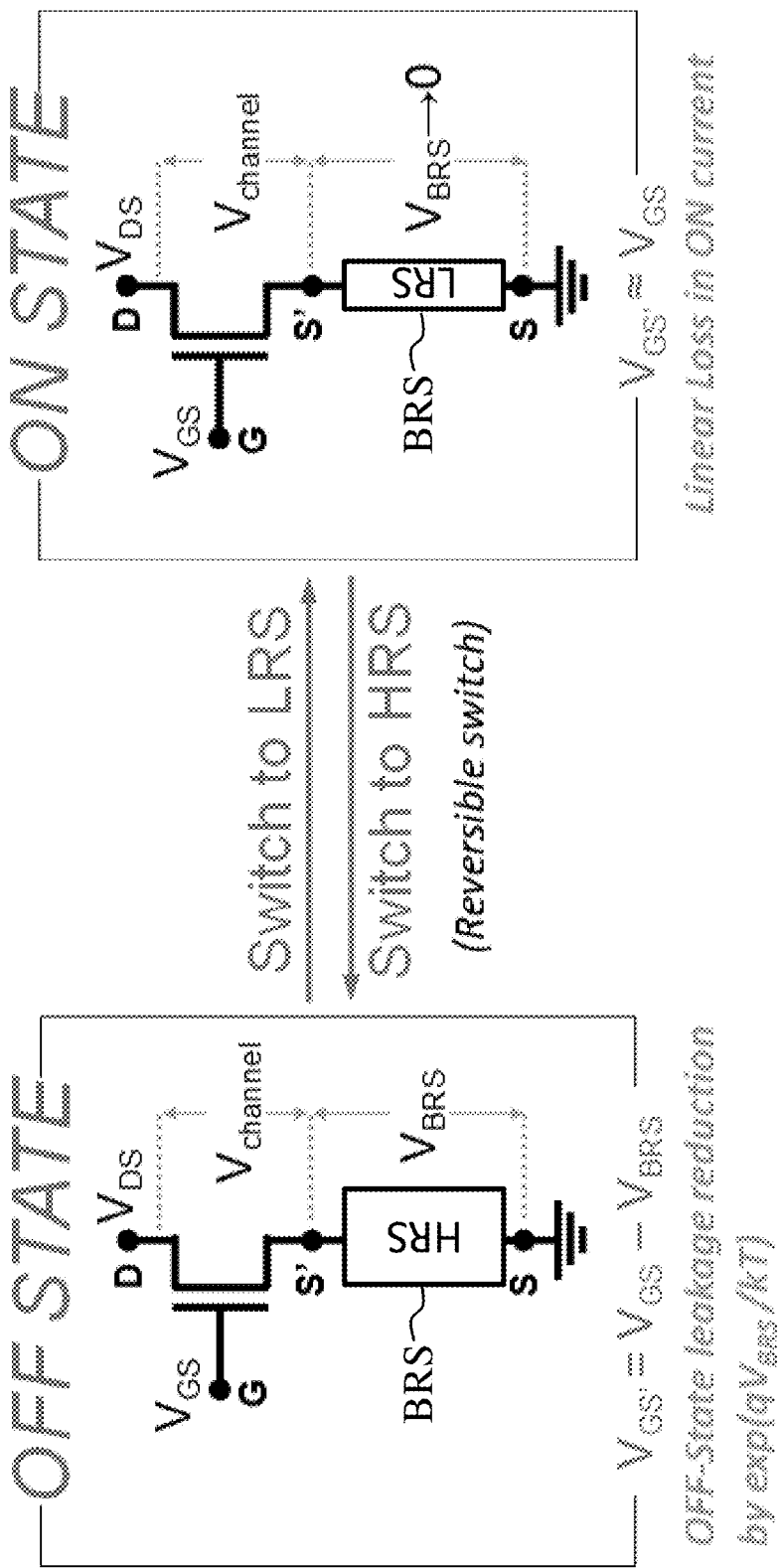
FIG. 1 depicts the operating principle of a Steep-Switch Vertical Field-Effect-Transistor (SS-VFET) circuit illustrating the voltage redistribution occurring during the reversible switch between OFF-state and ON-state when the Bi-stable Resistive System (BRS) reversibly switches between a High Resistance State (HRS) and a Low Resistance State (LRS) according to one or more embodiments of the invention.

The diagrams depicted herein are illustrative. There can be many variations to the diagram or the operations described therein without departing from the spirit of the invention. For instance, the actions can be performed in a differing order or actions can be added, deleted or modified.

In the accompanying figures and following detailed description of the described embodiments, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the present invention, as previously noted herein, some non-planar transistor device architectures, such as VFETs, employ semiconductor fins and side-gates that can be contacted outside the active region, resulting in increased device density over lateral devices. There are challenges, however, in scaling VFETs beyond the 10 nm node. One such challenge is the difficulty in designing sub-10 nm VFET architectures that can provide improved power consumption and high performance. An important measure of the quality of a transistor is the ratio of the on current to the off current. For energy efficient operation, a VFET should carry as little current as possible when there is no voltage between the gate and drain (the "OFF" state). To improve performance, however, a VFET should provide as much drive current as possible when a gate voltage is present (the "ON" state). Consequently, scaling known VFET circuit designs require a tradeoff between low power consumption (i.e., providing a low current when the transistor is in the "OFF" state) and high performance (i.e., providing a strong current when the transistor is in the "ON" state).

Another challenge in scaling VFETs beyond the 10 nm node is that shrinking transistor geometries continually reduces the maximum voltage that can be applied to a VFET gate without sacrificing reliability. To preserve performance, known VFET designs reduce the threshold voltage as well. As threshold voltage is reduced, the VFET cannot be switched from complete turn-off to complete turn-on with the limited voltage swing available. Subthreshold leakage (including subthreshold conduction, gate-oxide leakage and reverse-biased junction leakage) typically consumes upwards of half of the total power consumption of high-performance integrated circuit chips.

In the subthreshold operating regime of the VFET, when the gate voltage is lower than a threshold, the drain current versus gate voltage behavior is typically approximated by a linear curve. The slope of this curve is referred to as a subthreshold slope. Conventional metal-oxide-semiconductor field effect transistors ("MOSFETs") typically have a subthreshold slope that is thermally limited to about 60 mV per decade at room temperature (about 300 Kelvin). In other words, for typical VFET transistors, increasing the gate voltage by about 60 mV results in a corresponding drain current increase of less than about a factor of 10. This limited subthreshold slope cannot provide arbitrarily fast transitions between "OFF" (low current) and "ON" (high current) states of the VFET transistor.

Turning now to an overview of aspects of the present invention, one or more embodiments of the invention provide a steep-switch VFET (SS-VFET). The SS-VFET architecture described herein leverages a Bi-Stable Resistive System (BRS) to greatly improve the maximum available subthreshold slope. In other words, a subthreshold slope much less than the fundamental Boltzmann limit of 60 mV per decade at room temperature is achievable. The BRS includes any material or combination of materials that exhibits a unipolar, abrupt, reversible, and electrically triggered resistance switch between two stable resistance states, such as, for example, insulator-to-metal transition (IMT) materials, threshold-switching selectors (TSS), resistive memories, and Spin-Transfer-Torque structures.

FIG. 1 illustrates the operating principle of an exemplary SS-VFET-based BRS according to embodiments of the invention. The exemplary SS-VFET-based BRS switches between a High Resistance State (HRS) and a Low Resistance State (LRS). A BRS exhibits a unipolar abrupt reversible and electrically triggered resistance switch between two stable resistance states (i.e., a high resistance state and a low resistance state). This reversible resistance switch can be electrically triggered for positive and negative voltage polarities and consequently, BRSs are applicable to both nFET and pFET (i.e., BRSs are CMOS compatible). When the SS-VFET is in the "OFF" state, the BRS is in the insulating HRS. The effective gate voltage of the SS-FET ($V_{GS}$) is reduced by the potential drop across the BRS due to the large insulator resistance. Consequently, the OFF-state leakage of the MOSFET is exponentially reduced by ($qV_{BRS}/kT$). Conversely, when the SS-VFET is in the "ON" state, the BRS is in the metallic LRS. The effective gate voltage of the SS-FET ($V_{GS'}$) becomes substantially equal to $V_{GS}$, since the potential drop across the BRS becomes negligible. In other words, when the BRS is in the metallic LRS the resistance of the BRS is multiple orders of magnitude lower than the resistance across the gate. Consequently, there is a negligible loss in ON-current.

Figure 2:
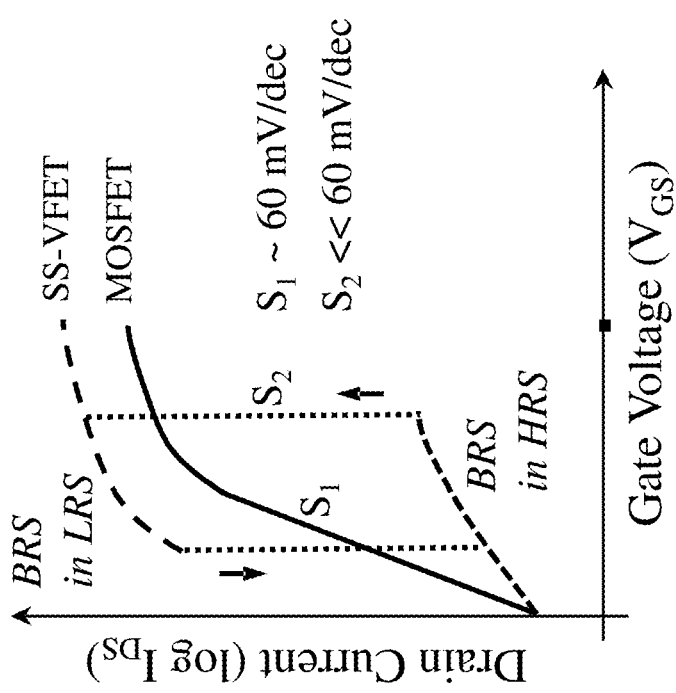
FIG. 2 depicts schematic plots of the transfer characteristics (drain current vs gate voltage) at matching OFF-current for a conventional MOSFET device and for a SS-VFET incorporating a BRS formed according to one or more embodiments of the invention.

FIG. 2 depicts schematic plots of the transfer characteristics (drain current vs gate voltage) at matching OFF-current for a conventional MOSFET device and for a SS-VFET incorporating a BRS formed according to one or more embodiments of the invention. Without wishing to be bound by theory, a conventional MOSFET system is intrinsically limited by carrier density modulation through Fermi level movement. Accordingly, Fermi-Dirac statistics apply and the subthreshold swing is restricted to 60 mV per decade at room temperature. In contrast to conventional systems, the electrically induced abrupt resistivity change possible in a bi-stable-resistive system enables steep-slope switching (sub-kT/q). The high-resistivity insulating state (HRS) of the BRS exponentially reduces the OFF-state leakage current ($I_{OFF}$) while the abrupt switch to the low-resistivity metallic state (LRS) results in a negligible reduction in ON-state drive current ($I_{ON}$). Consequently, a steep subthreshold swing (i.e., a switching slope $S_2 \ll 60$ mV/dec, for example, 5 mV/dec) is possible and the $I_{ON}/I_{OFF}$ ratio is greatly improved.

Turning now to a more detailed description of aspects of the present invention, a BRS is formed on a SS-VFET source and/or drain. FIGS. 3A-8B depict a top-type monolithic integration of a BRS within a VFET architecture for SS-VFET implementation according to one or more embodiments of the present invention. In a top-type integration scheme the BRS is inserted between the top S/D region and the top S/D contact. FIGS. 9A-15 depict a bottom-type monolithic integration of a BRS within a VFET architecture for SS-VFET implementation according to one or more embodiments of the present invention. In a bottom-type integration scheme the BRS is inserted between the bottom S/D region and the bottom S/D contact. While described separately for ease of discussion, top-type and bottom-type monolithic integration schemes can be combined within a single process to form a dual-BRS SS-VFET.

In some embodiments of the present invention, the BRS is monolithically integrated during an otherwise conventional middle-of-line process. Monolithic integration is well-suited to retrofit opportunities where the BRS serves as a performance booster, extending the life of existing mature technology nodes at minor extra cost and complexity. Moreover, middle-of-line monolithic BRS integration advantageously allows for conventional channel materials. In other words, the BRS supplements, but does not replace, the conventional channel, simplifying integration and maintaining CMOS compatibility.

Figure 3A:
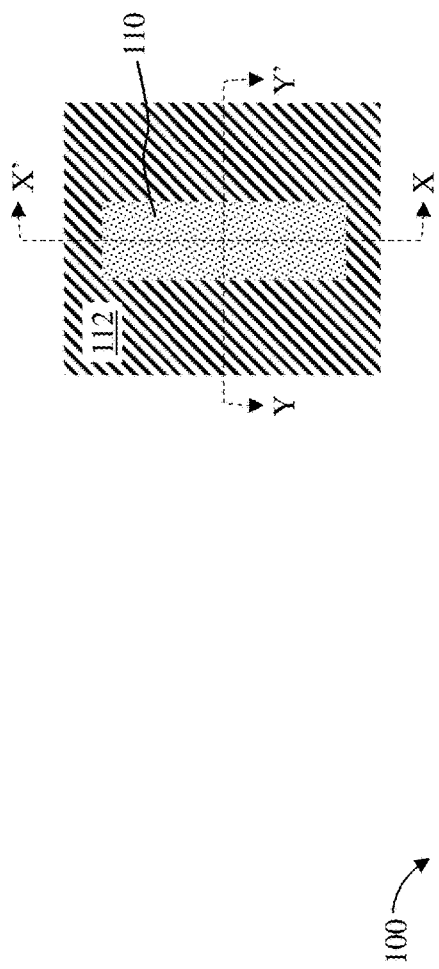
FIG. 3A depicts a top-down view of a semiconductor structure after a processing operation according to one or more embodiments of the invention.
Figure 3C:
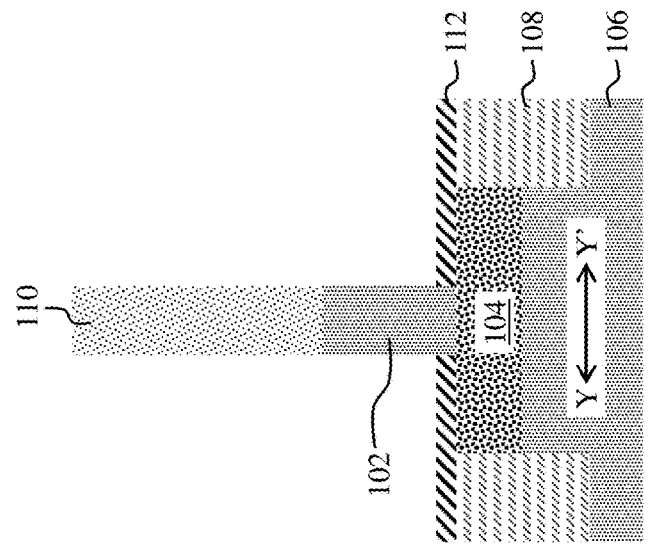
FIGS. 3B and 3C depict cross-sectional views of the semiconductor structure shown in FIG. 3A taken along the lines X-X' and Y-Y'.
Figure 3B:
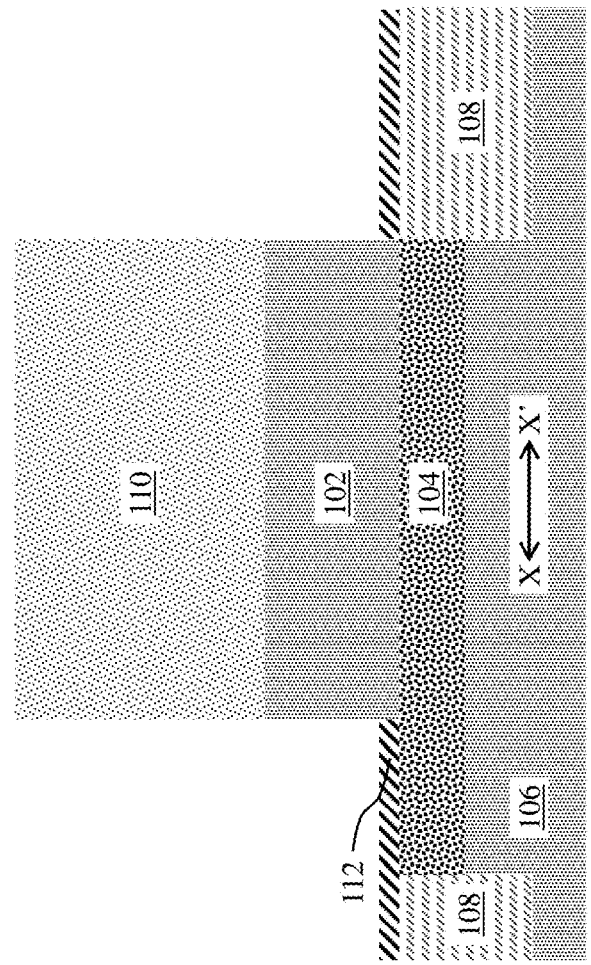

FIG. 3A depicts a top-down view of a SS-VFET structure 100 during an intermediate operation of a method of fabricating a semiconductor device according to one or more embodiments of the invention. FIGS. 3B and 3C depict cross-sectional views of the SS-VFET structure 100 along a direction X-X' (parallel to fin direction) and a direction Y-Y' (perpendicular to fin direction) during an intermediate operation of a method of fabricating a semiconductor device according to one or more embodiments of the invention. As depicted in FIGS. 3A-3C, a partially fabricated semiconductor device can include one or more vertical semiconductor fins 102 (hereinafter semiconductor fins 102) formed on a bottom S/D region 104 of a substrate 106. Each of the semiconductor fins 102 can have a height ranging from 1 nm to 150 nm, for example, from 10 nm to 50 nm. Each of the semiconductor fins 102 can have a width ranging from 5 nm to 40 nm, for example, from 10 nm to 20 nm. Adjacent semiconductor fins (not depicted) can be separated by a pitch ranging from 20 nm to 100 nm, for example, from 30 nm to 50 nm.

The substrate 106 can be any suitable substrate material, such as, for example, monocrystalline Si, SiGe, SiC, III-V compound semiconductor, II-VI compound semiconductor, or semiconductor-on-insulator (SOI). In some embodiments of the invention, the substrate 106 includes a buried oxide layer (not depicted). The semiconductor fins 102 can be electrically isolated from other regions of the substrate 106 by a shallow trench isolation (STI) 108. The STI 108 can be of any suitable dielectric material, such as, for example, a silicon oxide. Any known manner of forming the STI 108 can be utilized. In some embodiments of the invention, the STI 108 is formed by etching back the substrate 106 to form a trench, filling the trench with the STI 108 material, and planarizing to a surface of the substrate 106 using, for example, a CMP process.

The bottom S/D region 104 can be a source or drain region formed in the substrate 106 by a variety of methods, such as, for example, in-situ doped epitaxy, doped following the epitaxy, or by implantation and plasma doping. The bottom S/D region 104 can be formed by any suitable process, including but not limited to, ultrahigh vacuum chemical vapor deposition (UHVCVD), rapid thermal chemical vapor deposition (RTCVD), metalorganic chemical vapor deposition (MOCVD), low-pressure chemical vapor deposition (LPCVD), limited reaction processing CVD (LRPCVD), and MBE. In some embodiments of the invention, the bottom S/D region 104 includes epitaxial semiconductor materials grown from gaseous or liquid precursors. In some embodiments of the invention, epitaxial regions are epitaxially grown over the substrate 106. Epitaxial semiconductor materials can be grown using vapor-phase epitaxy (VPE), MBE, liquid-phase epitaxy (LPE), or other suitable processes. Epitaxial silicon, SiGe, and/or carbon doped silicon (Si:C) can be doped during deposition (in-situ doped) by adding dopants, n-type dopants (e.g., phosphorus or arsenic) or p-type dopants (e.g., Ga, B, $BF_2$, or Al). The dopant concentration in the doped regions can range from $1 \times 10^{19}$ cm$^{-3}$ to $2 \times 10^{21}$ cm$^{-3}$, or between $1 \times 10^{20}$ cm$^{-3}$ and $1 \times 10^{21}$ cm$^{-3}$.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments of the invention, epitaxial growth and/or deposition processes are selective to forming on semiconductor surface, and generally do not deposit material on exposed surfaces, such as silicon dioxide or silicon nitride surfaces.

In some embodiments of the invention, the gas source for the deposition of epitaxial semiconductor material includes a silicon containing gas source, a germanium containing gas source, or a combination thereof. For example, an epitaxial Si layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. An epitaxial silicon germanium alloy layer can be formed utilizing a combination of such gas sources. Carrier gases like hydrogen, nitrogen, helium and argon can be used. In some embodiments of the invention, the doped regions include silicon. In some embodiments of the invention, the doped regions include carbon doped silicon (Si:C). This Si:C layer can be grown in the same chamber used for other epitaxy steps or in a dedicated Si:C epitaxy chamber. The Si:C can include carbon in the range of about 0.2 percent to about 3.0 percent.

A hard mask 110 is formed on a surface of the semiconductor fin 102. In some embodiments of the invention, the hard mask 110 includes an oxide, such as, for example, $SiO_2$. In some embodiments of the invention, the hard mask 110 includes amorphous silicon (a-Si). In some embodiments of the invention, the hard mask 110 includes a nitride, such as, for example, silicon nitride.

A bottom spacer 112 is formed on the bottom S/D region 104, substrate 106, and STI 108. The bottom spacer 112 can include a dielectric material, such as silicon oxide, silicon nitride, silicon oxynitride, or a combination thereof, and can be formed using known deposition processes. In some embodiments of the invention, the bottom spacer 112 is formed by performing a directional deposition process such as, for example, a Gas Cluster Ion Beam (GCIB) process. The GCIB process is a deposition process that can be highly directional in nature. For example, the directional deposition process can result in the deposition of dielectric material on the horizontally oriented surfaces of the device, such as the upper surface of the substrate 106, while avoiding deposition of any substantial amount of dielectric material on the vertically-oriented surfaces of the device, such as sidewalls of the semiconductor fins 102.

Figures 4A, 4B:
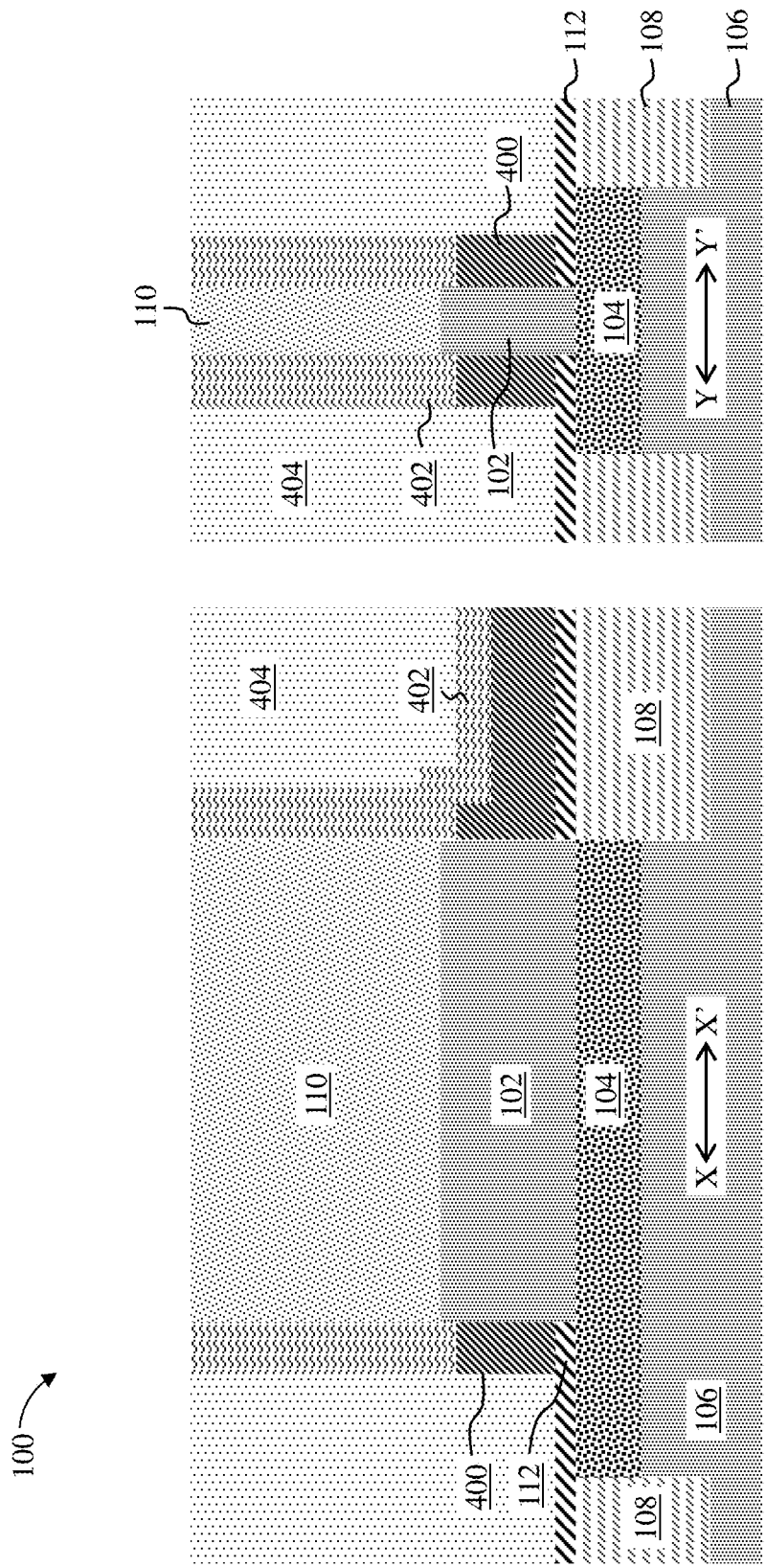
FIGS. 4A and 4B depict the cross-sectional views of the semiconductor structure along the lines X-X' and Y-Y' after a processing operation according to one or more embodiments of the invention.

FIGS. 4A and 4B depict the cross-sectional views of the SS-VFET structure 100 along X-X' and Y-Y' after forming and patterning a conductive gate 400 during an intermediate operation of the exemplary method of fabricating a semiconductor device according to one or more embodiments of the invention. As depicted in FIGS. 4A and 4B, the conductive gate 400 can be formed by, for example, deposition on a surface of the bottom spacer 112 and over channel regions (i.e., sidewalls) of the semiconductor fins 102. In some embodiments of the invention, the conductive gate 400 is overfilled above a surface of the semiconductor fins 102. In some embodiments of the invention, the conductive gate 400 is recessed below a surface of the semiconductor fins 102. In some embodiments of the invention, portions of the conductive gate 400 in non-channel regions of the SS-VFET structure 100 are further recessed via, e.g., chamfering, to reduce gate resistance and parasitic capacitance.

In some embodiments of the present invention, a top spacer 402 can be formed over the conductive gate 400 and on sidewalls of the semiconductor fins 102 and the hard mask 110. The top spacer 402 can include a dielectric material, such as silicon oxide, silicon nitride, silicon oxynitride, SiCO, or a combination thereof, and can be formed using known deposition processes. In some embodiments of the invention, the top spacer 402 can include a same material as the hard mask 110. In some embodiments of the present invention, the top spacer 400 is formed prior to the conductive gate 400 in a gate-last process (also known as a replacement metal gate (RMG) or sacrificial gate process).

The conductive gate 400 can be patterned by any lithographic process or etching methodology, such as, for example, a wet etch, a dry etch, or a combination of sequential wet and/or dry etches. The lithographic process can include applying a photoresist (not depicted) over the conductive gate 400, exposing portions of the photoresist to a desired pattern of radiation, and developing the exposed portions of photoresist. The pattern can then be transferred to the conductive gate 400 using, for example, RIE. In some embodiments of the invention, the conductive gate 400 is patterned using RIE selective to the top spacer 402 and/or the substrate 106.

In some embodiments of the invention, the conductive gate 400 can be a high-k metal gate (HKMG) and can include, for example, one or more gate dielectric materials, one or more work function metals (WFM), and one or more metal gate conductor materials. The gate dielectric material (not depicted) can be a dielectric material having a dielectric constant greater than 3.9, 7.0, or 10.0. Non-limiting examples of suitable materials for the dielectric material include oxides, nitrides, oxynitrides, silicates (e.g., metal silicates), aluminates, titanates, nitrides, or any combination thereof. Examples of high-k materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material can further include dopants such as, for example, lanthanum and aluminum. The gate dielectric material can be formed by suitable deposition processes, for example, CVD, PECVD, atomic layer deposition (ALD), evaporation, physical vapor deposition (PVD), chemical solution deposition, or other like processes. The thickness of the dielectric material can vary depending on the deposition process as well as the composition and number of high-k dielectric materials used. The dielectric material layer can have a thickness in a range from about 0.5 to about 20 nm.

The work function metal (not depicted) can be disposed over the gate dielectric material. The type of work function metal depends on the type of transistor and can differ between the nFET and pFET devices. Non-limiting examples of suitable work function metals include p-type work function metals and n-type work function metals. P-type work function metals include compositions such as ruthenium, palladium, platinum, cobalt, nickel, and conductive metal oxides, or any combination thereof. N-type work function metals include compositions such as hafnium, zirconium, titanium, tantalum, aluminum, metal carbides (e.g., hafnium carbide, zirconium carbide, titanium carbide, and aluminum carbide), aluminides, or any combination thereof. The work function metal can be deposited by a suitable deposition process, for example, CVD, PECVD, PVD, plating, thermal or e-beam evaporation, and sputtering.

The gate conductor material (not depicted) is deposited over the gate dielectric material and work function metal to form the HKMG. Non-limiting examples of suitable conductive metals include aluminum (Al), platinum (Pt), gold (Au), tungsten (W), titanium (Ti), or any combination thereof. The gate conductor material can be deposited by a suitable deposition process, for example, CVD, PECVD, PVD, plating, thermal or e-beam evaporation, and sputtering.

In some embodiments of the present invention, an interlayer dielectric (ILD) 404 is formed over the structure 100. The ILD 404 can be any suitable dielectric material, such as, for example, a silicon oxide, and can be formed using any suitable process. In some embodiments of the invention, the ILD 404 is planarized to a surface of the top spacer 402 and/or hard mask 110 using, for example, CMP. In some embodiments of the invention, the CMP can be utilized to remove excess portions of the ILD 404 selective to the top spacer 402 and/or hard mask 110.

Figures 5A, 5B:
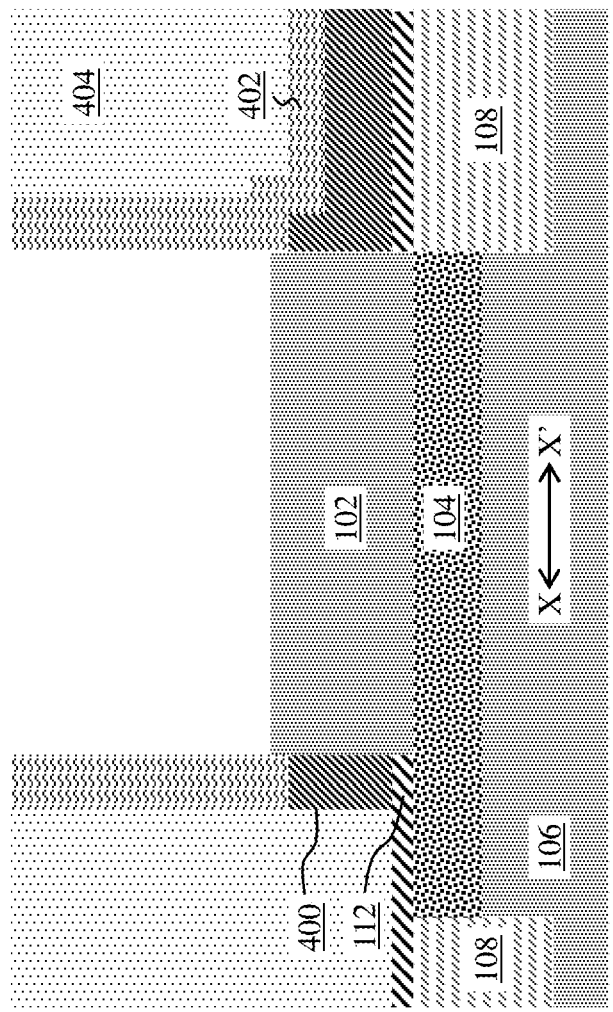
FIGS. 5A and 5B depict the cross-sectional views of the semiconductor structure along the lines X-X' and Y-Y' after a processing operation according to one or more embodiments of the invention.

FIGS. 5A and 5B depict the cross-sectional views of the SS-VFET structure 100 along X-X' and Y-Y' after removing the hard mask 110 during an intermediate operation of the exemplary method of fabricating a semiconductor device according to one or more embodiments of the invention. The hard mask 110 can be removed using any suitable process, such as, for example, a wet etch, a dry etch, or a combination of sequential wet and/or dry etches. In some embodiments of the invention, a material of the hard mask 110 is selected such that the etching process is selective to the semiconductor fin 102 and/or the top spacer 402.

Figure 6A:
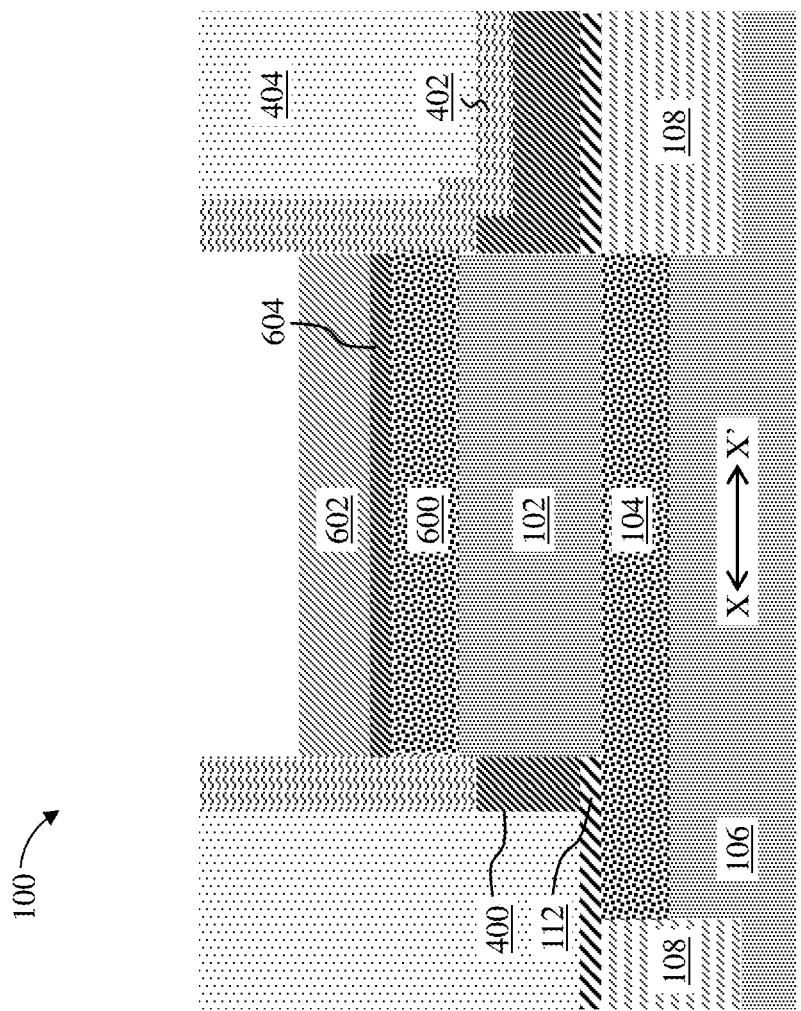
FIGS. 6A and 6B depict the cross-sectional views of the semiconductor structure along the lines X-X' and Y-Y' after a processing operation according to one or more embodiments of the invention.
Figure 6B:
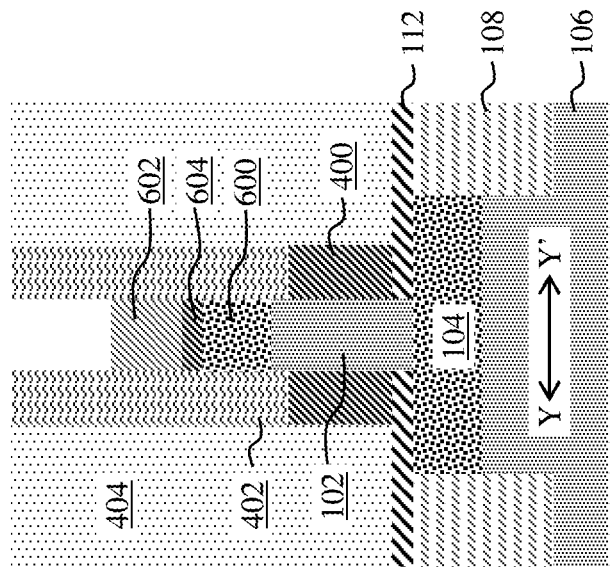

FIGS. 6A and 6B depict the cross-sectional views of the SS-VFET structure 100 along X-X' and Y-Y' after forming a top S/D region 600 on the semiconductor fins 102 during an intermediate operation of the exemplary method of fabricating a semiconductor device according to one or more embodiments of the invention. As depicted in FIGS. 6A and 6B, the top S/D region 600 is formed on exposed portions of the semiconductor fins 102. The top S/D region 600 can be an epitaxial silicon layer epitaxially grown using known processes. Epitaxial materials can be grown from gaseous or liquid precursors. In some embodiments of the invention of the invention, the gas source for the deposition of epitaxial semiconductor materials can include a silicon containing gas source, a germanium containing gas source, or a combination thereof. Epitaxial materials can be grown using, for example, VPE, MBE, or LPE. Epitaxial silicon, silicon germanium, and/or carbon doped silicon (Si:C) can be doped during deposition (in-situ doped) by adding n-type dopants (e.g., phosphorus or arsenic) or p-type dopants (e.g., boron or gallium), depending on the type of transistor. The dopant concentration in the top S/D region 600 can range from about $1\times10^{19}$ cm$^{-3}$ to about $2\times10^{21}$ cm$^{-3}$, for example, between about $2\times10^{20}$ cm$^{-3}$ and about $1\times10^{21}$ cm$^3$.

A top S/D metallization layer 602 is formed over the top S/D region 600 using known metallization techniques. The top S/D metallization layer 602 can be made of any suitable conducting material, such as, for example, metal (e.g., tungsten, titanium, tantalum, ruthenium, zirconium, cobalt, copper, aluminum, lead, platinum, tin, silver, gold), conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material can further include dopants that are incorporated during or after deposition. In some embodiments of the invention, the top S/D metallization layer 602 includes a metal (e.g., titanium) that reacts with the top S/D region 600 to form a silicide film 604 between the top S/D region 600 and the top S/D metallization layer 602. As the silicide film 604 is only formed where the top S/D metallization layer 602 contacts the top S/D region 600 the silicide can be said to be self-aligned to the top S/D region 600 (a self-aligned silicide is also referred to as a salicide).

In some embodiments of the present invention, the top S/D metallization layer 602 is recessed below a surface of the top spacer 402. The top S/D metallization layer 602 can be recessed using any suitable process, such as, for example, a wet etch, a dry etch, or a combination of sequential wet and/or dry etches. In some embodiments of the invention, the top S/D metallization layer 602 is recessed using RIE selective to the top spacer 402.

Figure 7A:
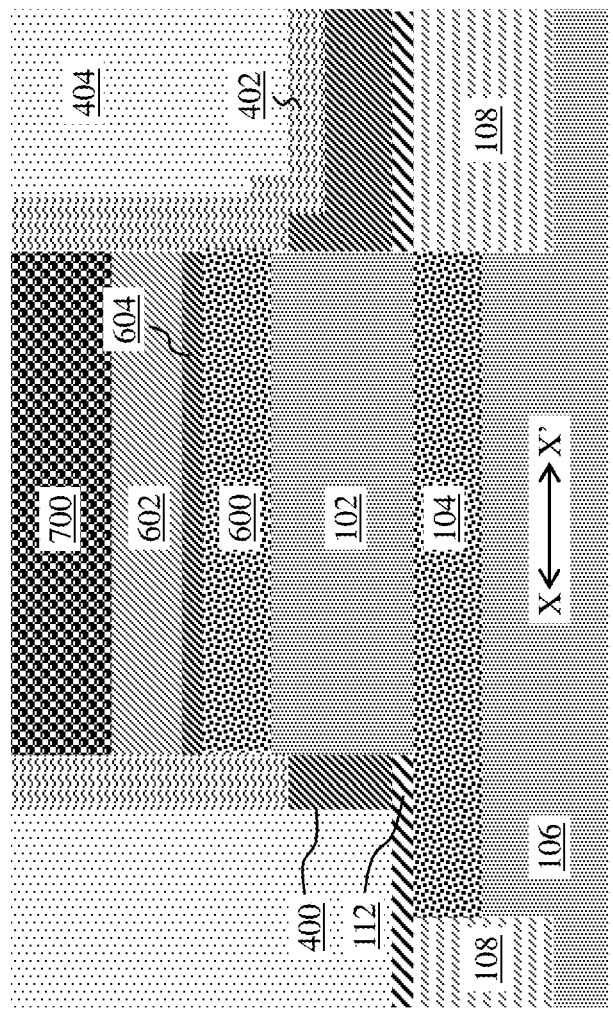
FIGS. 7A and 7B depict the cross-sectional views of the semiconductor structure along the lines X-X' and Y-Y' after a processing operation according to one or more embodiments of the invention.
Figure 7B:
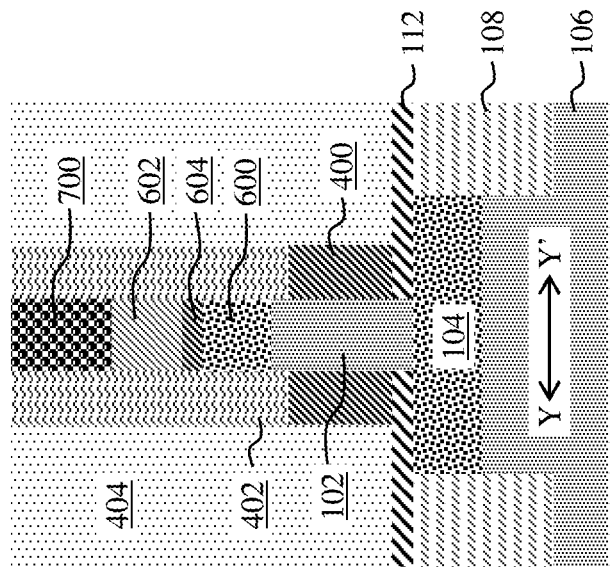

FIGS. 7A and 7B depict the cross-sectional views of the SS-VFET structure 100 along X-X' and Y-Y' after forming a BRS 700 on the top S/D metallization layer 602 during an intermediate operation of the exemplary method of fabricating a semiconductor device according to one or more embodiments of the invention. As discussed previously herein, the BRS 700 exhibits a unipolar, abrupt, reversible, and electrically triggered resistance switch between two stable resistance states (i.e., a high resistance state and a low resistance state).

In some embodiments of the present invention, the BRS 700 is formed from insulator-to-metal transition (IMT) materials. IMT materials include, for example, $VO_2$, $NbO_2$, $Ca_2RuO_4$, $LaCoO_3$, $Ti_2O_3$, $Ti_3O_5$, $SmNiO_3$, $NdNiO_3$, $V_2O_3$, $V_4O_7$, $Fe_3O_4$, any oxides of the form $ABO_3$-perovskite (e.g., $CaTiO_3$), and combinations thereof. IMT materials can be relaxed or strained and can be incorporated into 3D-bulk, 2D-thin films, and 1D-nanowires. In other embodiments of the present invention, the BRS 700 is formed from threshold-switching selectors (TSS). TSS systems are based on the combination of a thin insulator layer with a metal, such as, for example, Ag-doped $HfO_2$, $Cu/HfO_2$, $Ag/TiO_2$, $Cu_x$ S, Ag/a-Si, $AgTe/TiN/TiO_2/TiN$, $W/Cu_xS$, and combinations thereof. In still other embodiments of the present invention, the BRS 700 is formed from a combination of both IMT and TSS materials. In yet other embodiments of the present invention, the BRS 700 is formed from any system, material, or combination of materials known now or discovered in the future exhibiting a unipolar, abrupt, reversible, and electrically triggered resistance switch between two stable resistance states, such as, for example, resistive memories and Spin-Transfer-Torque structures. In some embodiments of the present invention, the BRS 700 is overfilled above a surface of the top spacer 402 and then planarized to the top spacer 402 using, for example, CMP.

FIGS. 8A and 8B depict the cross-sectional views of the SS-VFET structure 100 along X-X' and Y-Y' after forming a bottom S/D contact 800, a top S/D contact 802, and a gate contact 804 (collectively, the contacts) during an intermediate operation of the exemplary method of fabricating a semiconductor device according to one or more embodiments of the invention. The contacts 800, 802, and 804 can be formed using known metallization techniques. In some embodiments of the invention the thickness of the ILD 404 is increased by depositing additional dielectric material prior to forming the contacts 800, 802, and 804. The ILD 404 can then be patterned into open trenches (not depicted) using known processes, such as a wet or dry etch. In some embodiments of the invention, the contacts 800, 802, and 804 are overfilled into the trenches, forming overburdens above a surface of the ILD 404. In some embodiments of the invention, a CMP removes the overburden. In some embodiments of the invention, the trenches are patterned selective to the top spacer 402, the bottom spacer 112, the BRS 700, the bottom S/D 104, and/or the conductive gate 400. In this manner, contact trench misalignments are prevented. In other words, the contacts 800, 802, and 804 can be self-aligned to the top spacer 402, the BRS 700, and/or the conductive gate 400.

The bottom S/D contact 800, top S/D contact 802, and gate contact 804 can be made of any suitable conducting material, such as, for example, metal (e.g., tungsten, titanium, tantalum, ruthenium, zirconium, cobalt, copper, aluminum, lead, platinum, tin, silver, gold), conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material can further include dopants that are incorporated during or after deposition. In some embodiments of the present invention, a material of the contact 802 is selected to preserve switching compatibility with the BRS 700. In some embodiments of the present invention, the contacts 800, 802, and 804 are made of a same material. In other embodiments of the present invention, the contact 802 is made of a first material selected to preserve switching compatibility with the BRS 700 and the contacts 800 and 804 are made of a same second material. In some embodiments of the invention, the contacts 800, 802, and 804 can be copper and can include a barrier metal liner (not depicted). The barrier metal liner prevents the copper from diffusing into, or doping, the surrounding materials, which can degrade their properties. Silicon, for example, forms deep-level traps when doped with copper. An ideal barrier metal liner must limit copper diffusivity sufficiently to chemically isolate the copper conductor from the surrounding materials and should have a high electrical conductivity, for example, tantalum nitride and tantalum (TaN/Ta), titanium, titanium nitride, cobalt, ruthenium, and manganese.

Figure 9A:
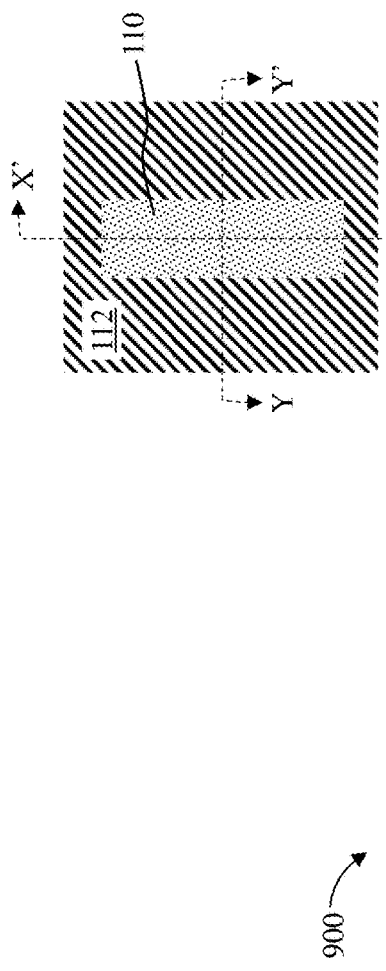
FIG. 9A depicts a top-down view of a semiconductor structure after a processing operation according to one or more embodiments of the invention.
Figure 9C:
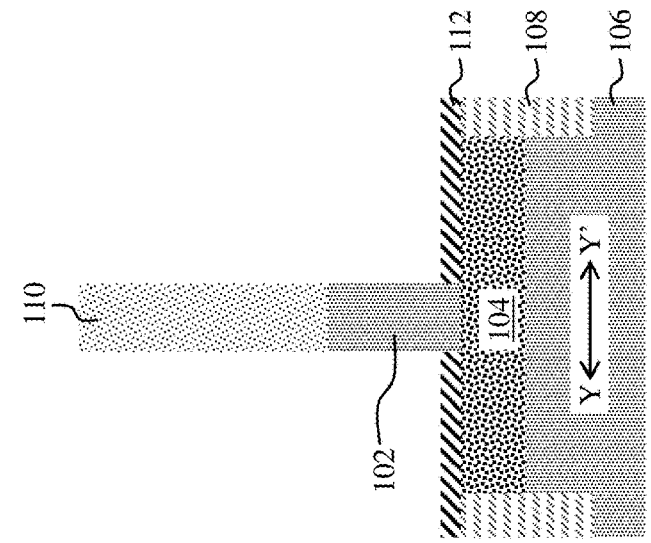
FIGS. 9B and 9C depict cross-sectional views of the semiconductor structure shown in FIG. 9A taken along the lines X-X' and Y-Y'.
Figure 9B:
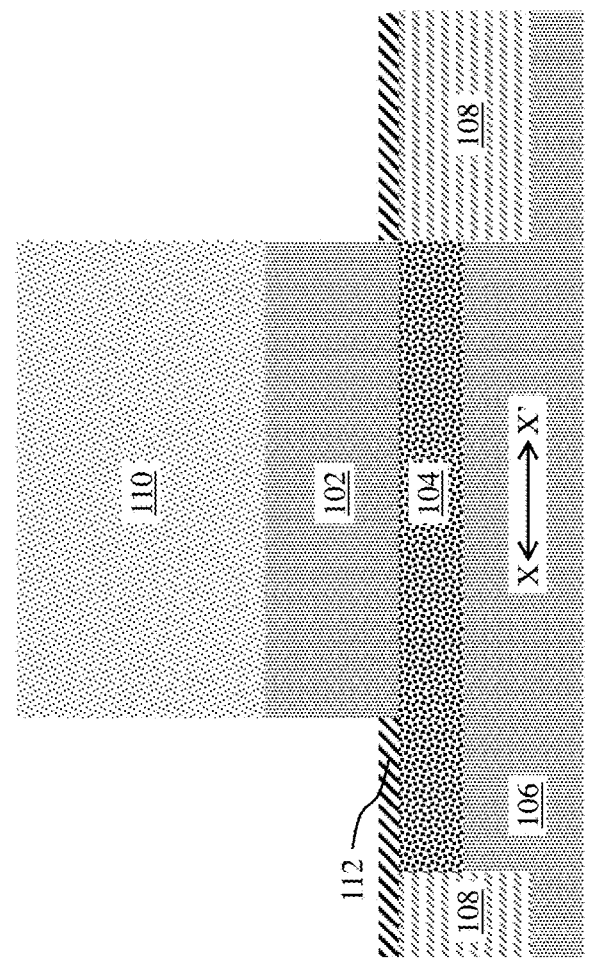

FIG. 9A depicts a top-down view of a SS-VFET structure 900 during an intermediate operation of a method of fabricating a semiconductor device according to one or more embodiments of the invention. FIGS. 9B and 9C depict cross-sectional views of the SS-VFET structure 900 along a direction X-X' (parallel to fin direction) and a direction Y-Y' (perpendicular to fin direction) during an intermediate operation of a method of fabricating a semiconductor device according to one or more embodiments of the invention. The SS-VFET structure 900 is similar to the SS-VFET structure 100 depicted in FIGS. 3A-3C and includes one or more vertical semiconductor fins 102, a bottom S/D region 104, a substrate 106, an STI 108, a hard mask 110, and a bottom spacer 112.

Figures 10A, 10B:
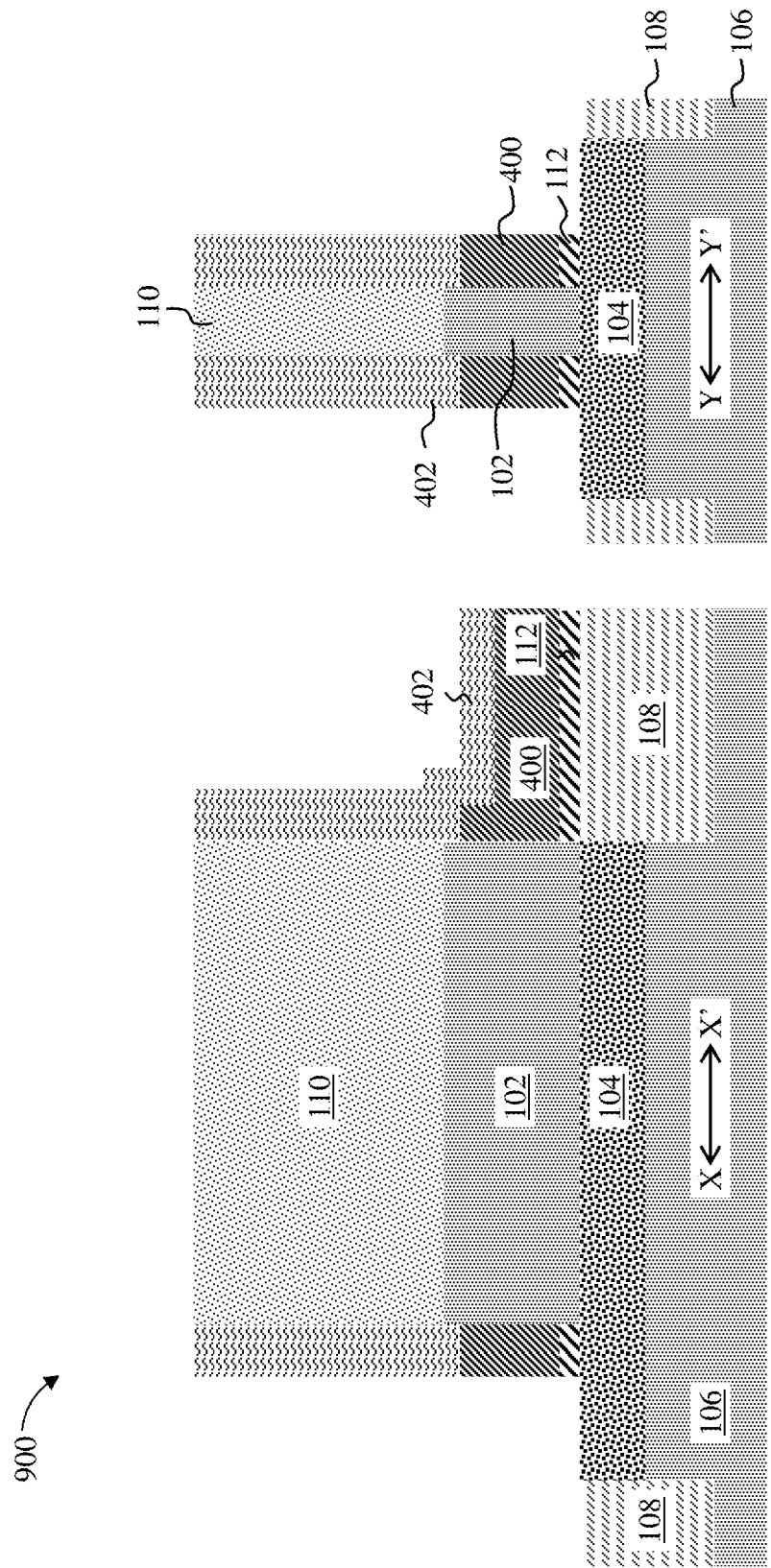
FIGS. 10A and 10B depict the cross-sectional views of the semiconductor structure along the lines X-X' and Y-Y' after a processing operation according to one or more embodiments of the invention.

FIGS. 10A and 10B depict the cross-sectional views of the SS-VFET structure 900 along X-X' and Y-Y' after forming and patterning a conductive gate 400 during an intermediate operation of the exemplary method of fabricating a semiconductor device according to one or more embodiments of the invention. As depicted in FIGS. 10A and 10B, the conductive gate 400 can be formed by, for example, deposition on a surface of the bottom spacer 112 and over channel regions (i.e., sidewalls) of the semiconductor fins 102. In some embodiments of the invention, the conductive gate 400 is overfilled above a surface of the semiconductor fins 102. In some embodiments of the invention, the conductive gate 400 is recessed below a surface of the semiconductor fins 102. In some embodiments of the invention, portions of the conductive gate 400 in non-channel regions of the SS-VFET structure 100 are further recessed via, e.g., chamfering, to reduce gate resistance and parasitic capacitance.

In some embodiments of the present invention, a top spacer 402 can be formed over the conductive gate 400 and on sidewalls of the semiconductor fins 102 and the hard mask 110. The top spacer 402 can include a dielectric material, such as silicon oxide, silicon nitride, silicon oxynitride, or a combination thereof, and can be formed using known deposition processes. In some embodiments of the invention, the top spacer 402 can include a same material as the hard mask 110. In some embodiments of the present invention, the top spacer 402 is formed prior to the conductive gate 400 in a gate-last process (also known as a replacement metal gate (RMG) or sacrificial gate process).

In some embodiments of the present invention, the conductive gate 400 and the bottom spacer 112 are patterned to expose a surface of the bottom S/D region 104. Any suitable lithographic process or etching methodology can be used, such as, for example, a wet etch, a dry etch, or a combination of sequential wet and/or dry etches. In some embodiments of the invention, the conductive gate 400 and the bottom spacer 112 are patterned using RIE selective to the top spacer 402.

FIGS. 11A and 11B depict the cross-sectional views of the SS-VFET structure 900 along X-X' and Y-Y' after forming a thin spacer 1100 on sidewalls of the top spacer 402, the conductive gate 400, and the bottom spacer 112. The thin spacer 1100 can include a dielectric material, such as silicon oxide, silicon nitride, silicon oxynitride, or a combination thereof, and can be formed using known deposition processes. After forming the thin spacer 1100, portions of the bottom S/D region 104 are recessed. In some embodiments of the present invention, exposed portions of the bottom S/D region 104 are recessed below a surface of the STI 108. The bottom S/D region 104 can be recessed using, for example, a wet etch, a dry etch, or a combination of sequential wet and/or dry etches. In some embodiments of the present invention, the bottom S/D region 104 is recessed using a timed RIE selective to the thin spacer 1100 and/or the STI 108 to achieve the desired recess depth.

FIGS. 12A and 12B depict the cross-sectional views of the SS-VFET structure 900 along X-X' and Y-Y' after forming a bottom S/D metallization layer 1200 in the bottom S/D region 104 recess during an intermediate operation of the exemplary method of fabricating a semiconductor device according to one or more embodiments of the invention. The bottom S/D metallization layer 1200 is formed to partially fill the recess using known metallization techniques and can be made of any suitable conducting material, such as, for example, metal (e.g., tungsten, titanium, tantalum, ruthenium, zirconium, cobalt, copper, aluminum, lead, platinum, tin, silver, gold), conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material can further include dopants that are incorporated during or after deposition. In some embodiments of the invention, the bottom S/D metallization layer 1200 includes a metal (e.g., titanium) that reacts with the bottom S/D region 104 to form a silicide film 1202 between the bottom S/D region 104 and the bottom S/D metallization layer 1200. As the silicide film 1202 is only formed where the bottom S/D metallization layer 1200 contacts the bottom S/D region 104 the silicide can be said to be self-aligned to the bottom S/D region 104 recess.

A BRS 1204 is formed on the bottom S/D metallization layer 1200. As discussed previously herein, the BRS 1204 exhibits a unipolar, abrupt, reversible, and electrically triggered resistance switch between two stable resistance states (i.e., a high resistance state and a low resistance state). In some embodiments of the present invention, the BRS 1204 is formed from IMT materials. IMT materials include, for example, $VO_2$, $NbO_2$, $Ca_2RuO_4$, $LaCoO_3$, $Ti_2O_3$, $Ti_3O_5$, $SmNiO_3$, $NdNiO_3$, $V_2O_3$, $V_4O_7$, $Fe_3O_4$, any oxides of the form $ABO_3$-perovskite (e.g., $CaTiO_3$), and combinations thereof. IMT materials can be relaxed or strained and can be incorporated into 3D-bulk, 2D-thin films, and 1D-nanowires. In other embodiments of the present invention, the BRS 1204 is formed from TSS systems. TSS systems are based on the combination of a thin insulator layer with a metal, such as, for example, Ag-doped $HfO_2$, $Cu/HfO_2$, $Ag/TiO_2$, $Cu_xS$, Ag/a-Si, $AgTe/TiN/TiO_2/TiN$, and $W/Cu_xS$. In still other embodiments of the present invention, the BRS 1204 is formed from a combination of both IMT and TSS materials. In yet other embodiments of the present invention, the BRS 700 is formed from any system, material, or combination of materials known now or discovered in the future exhibiting a unipolar, abrupt, reversible, and electrically triggered resistance switch between two stable resistance states, such as, for example, resistive memories and Spin-Transfer-Torque structures. In some embodiments of the present invention, the BRS 1204 is overfilled above a surface of the STI 108 and then planarized to the STI 108 using, for example, CMP.

FIGS. 13A and 13B depict the cross-sectional views of the SS-VFET structure 900 along X-X' and Y-Y' after forming a top S/D region 1300 on the semiconductor fins 102 during an intermediate operation of the exemplary method of fabricating a semiconductor device according to one or more embodiments of the invention. As depicted in FIGS. 13A and 13B, the top S/D region 1300 is formed on exposed portions of the semiconductor fins 102. The top S/D region 1300 can be an epitaxial silicon layer epitaxially grown in a similar manner as the top S/D region 600 (depicted in FIGS. 6A and 6B). In some embodiments of the present invention, an ILD 1302 is formed over the SS-VFET structure 900 and planarized to a surface of the semiconductor fin 102 prior to forming the top S/D region 1300.

FIGS. 14A and 14B depict the cross-sectional views of the SS-VFET structure 900 along X-X' and Y-Y' after forming a bottom S/D contact 1400, a top S/D contact 1402, and a gate contact 1404 (collectively, the contacts) during an intermediate operation of the exemplary method of fabricating a semiconductor device according to one or more embodiments of the invention. The contacts 1400, 1402, and 1404 can be formed using known metallization techniques. In some embodiments of the invention the thickness of the ILD 1302 is increased by depositing additional dielectric material prior to forming the contacts 1400, 1402, and 1404. The ILD 1302 can then be patterned into open trenches (not depicted) using known processes, such as a wet or dry etch. In some embodiments of the invention, the contacts 1400, 1402, and 1404 are overfilled into the trenches, forming overburdens above a surface of the ILD 1302. In some embodiments of the invention, a CMP removes the overburden. In some embodiments of the invention, the trenches are patterned selective to the BRS 1204, top S/D region 1300, and/or conductive gate 400.

The bottom S/D contact 1400, top S/D contact 1402, and gate contact 1404 can be made of any suitable conducting material, such as, for example, metal (e.g., tungsten, titanium, tantalum, ruthenium, zirconium, cobalt, copper, aluminum, lead, platinum, tin, silver, gold), conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material can further include dopants that are incorporated during or after deposition. In some embodiments of the present invention, a material of the contact 1400 is selected to preserve switching compatibility with the BRS 1204. In some embodiments of the present invention, the contacts 1400, 1402, and 1404 are made of a same material. In other embodiments of the present invention, the contact 1400 is made of a first material selected to preserve switching compatibility with the BRS 1204 and the contacts 1402 and 1404 are made of a same second material. In some embodiments of the invention, the contacts 1400, 1402, and 1404 can be copper and can include a barrier metal liner (not depicted). The barrier metal liner prevents the copper from diffusing into, or doping, the surrounding materials, which can degrade their properties. Silicon, for example, forms deep-level traps when doped with copper. An ideal barrier metal liner must limit copper diffusivity sufficiently to chemically isolate the copper conductor from the surrounding materials and should have a high electrical conductivity, for example, tantalum nitride and tantalum (TaN/Ta), titanium, titanium nitride, cobalt, ruthenium, and manganese.

Figure 15:
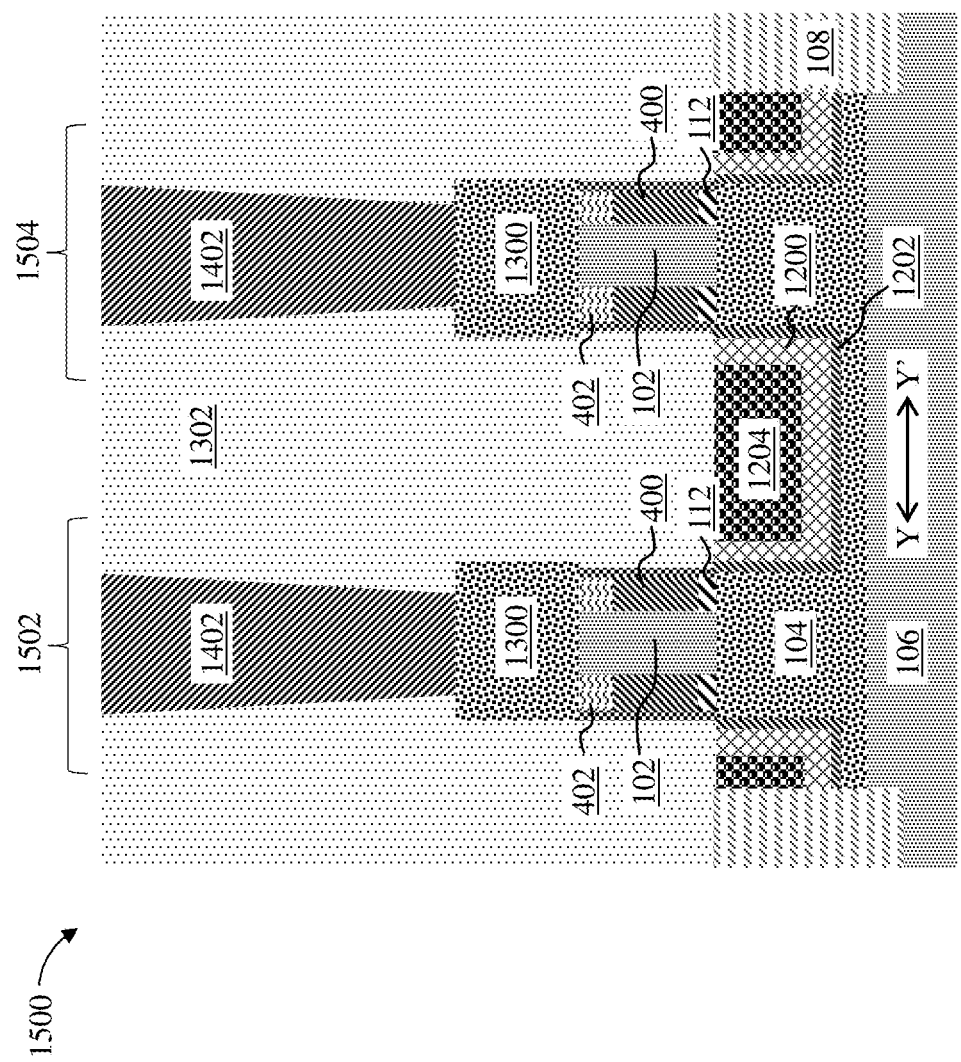
FIG. 15 depicts the cross-sectional view of the semiconductor structure along the line Y-Y' after a processing operation according to one or more embodiments of the invention.

FIG. 15 depicts a cross-sectional view of a semiconductor structure 1500 along Y-Y' after forming a first SS-VFET 1502 adjacent to a second SS-VFET 1504 according to one or more embodiments of the invention. A shared trench (not depicted) is formed between the SS-VFETs 1500 and 1502 by recessing the bottom S/D region 104. A bottom S/D metallization layer 1200 is formed in the bottom S/D region 104 recess and a BRS 1204 is formed on the bottom S/D metallization layer 1200, according to one or more embodiments of the present invention. In some embodiments of the invention, the bottom S/D metallization layer 1200 includes a metal (e.g., titanium) that reacts with the bottom S/D region 104 to form a silicide film 1202 between the bottom S/D region 104 and the bottom S/D metallization layer 1200.

Figure 16:
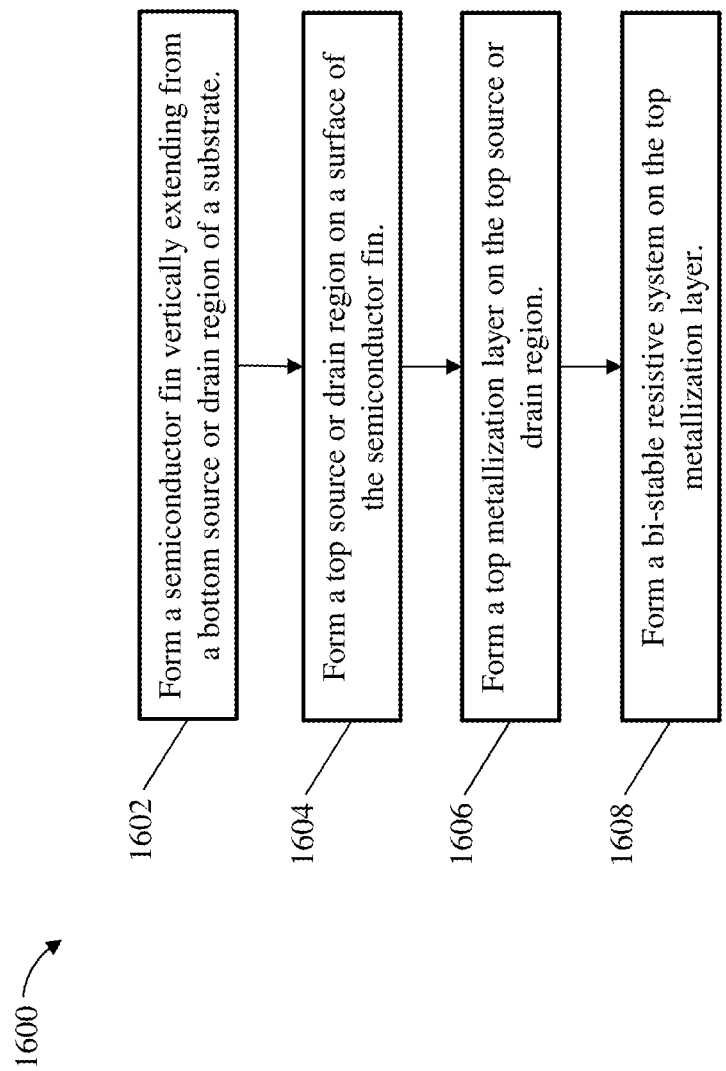
FIG. 16 depicts a flow diagram illustrating a method according to one or more embodiments of the invention.

FIG. 16 depicts a flow diagram 1600 illustrating a method for forming a SS-VFET according to one or more embodiments of the invention. As shown at block 1602, a semiconductor fin is formed vertically extending from a bottom source or drain region of a substrate. The semiconductor fin can be formed in a similar manner as the semiconductor fins 102 (as depicted in FIGS. 3A-3C) according to one or more embodiments.

As shown at block 1604, a top source or drain region is formed on a surface of the semiconductor fin. The top source or drain region can be formed in a similar manner as the top S/D region 600 (as depicted in FIGS. 6A and 6B) according to one or more embodiments.

As shown at block 1606, a top metallization layer is formed on the top source or drain region. The top metallization layer can be formed in a similar manner as the top S/D metallization layer 602 (as depicted in FIGS. 6A and 6B) according to one or more embodiments.

As shown at block 1608, a BRS is formed over the top metallization layer. The BRS can be formed in a similar manner as the BRS 700 (as depicted in FIGS. 7A and 7B) according to one or more embodiments.

Figure 17:
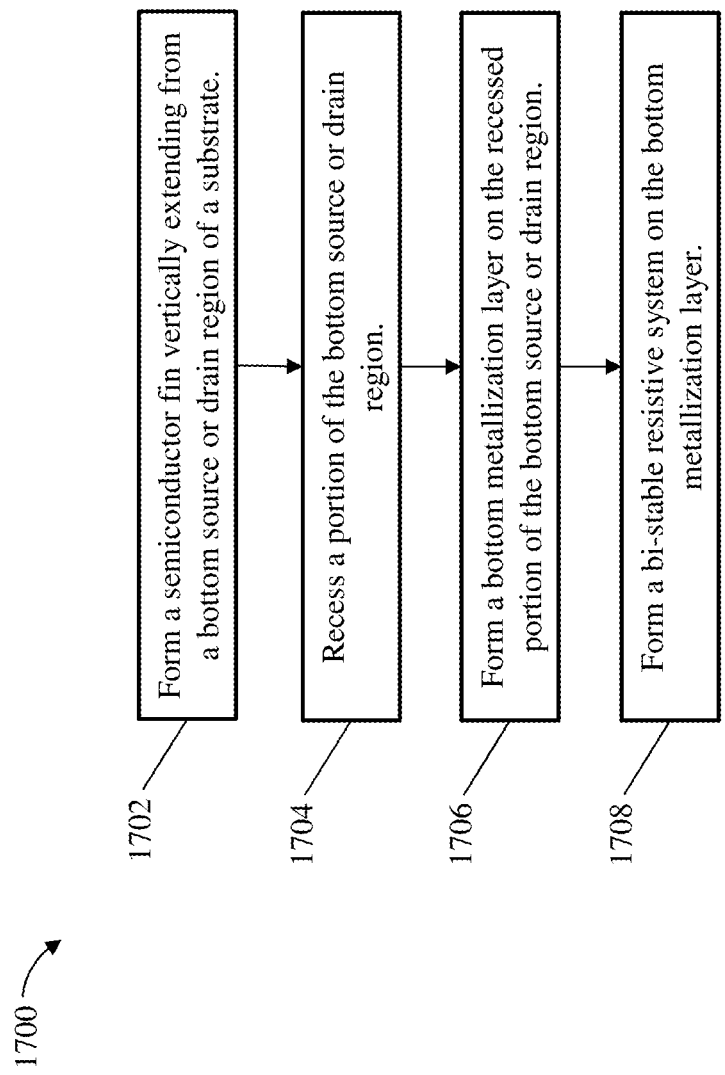
FIG. 17 depicts a flow diagram illustrating a method according to one or more embodiments of the invention.

FIG. 17 depicts a flow diagram 1700 illustrating a method for forming a SS-VFET according to one or more embodiments of the invention. As shown at block 1702, a semiconductor fin is formed vertically extending from a bottom source or drain region of a substrate. The semiconductor fin can be formed in a similar manner as the semiconductor fins 102 (as depicted in FIGS. 9A-9C) according to one or more embodiments.

As shown at block 1704, a portion of the bottom source or drain region is recessed according to one or more embodiments. At block 1706, a bottom metallization layer is formed on the recessed portion of the bottom source or drain region. The bottom metallization layer can be formed in a similar manner as the bottom S/D metallization layer 1200 (as depicted in FIGS. 12A and 12B) according to one or more embodiments.

As shown at block 1708, a BRS is formed on the bottom metallization layer. The BRS can be formed in a similar manner as the BRS 1204 (as depicted in FIGS. 12A and 12B) according to one or more embodiments.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, are used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (e.g., rotated 90 degrees or at other orientations), and the spatially relative descriptors used herein should be interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a {100} orientated crystalline surface can take on a {100} orientation. In some embodiments of the invention of the invention, epitaxial growth and/or deposition processes can be selective to forming on semiconductor surface, and can not deposit material on exposed surfaces, such as silicon dioxide or silicon nitride surfaces.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method for forming a semiconductor device, the method comprising:
    forming a semiconductor fin vertically extending from a bottom source or drain region of a substrate;
    recessing a portion of the bottom source or drain region;
    forming a bottom metallization layer on the recessed portion of the bottom source or drain region; and
    forming a bi-stable resistive system on the bottom metallization layer.

2. The method of claim 1, wherein the semiconductor device comprises a subthreshold switching slope of less than 60 millivolts per decade.

3. The method of claim 1, wherein the semiconductor device comprises a subthreshold switching slope of about 5 millivolts per decade.

4. The method of claim 1, wherein the bi-stable resistive system comprises an insulator-to-metal transition material.

5. The method of claim 4, wherein the insulator-to-metal transition material comprises $VO_2$, $NbO_2$, $Ca_2RuO_4$, $LaCoO_3$, $Ti_2O_3$, $Ti_3O_5$, $SmNiO_3$, $NdNiO_3$, $V_2O_3$, $V_4O_7$, $Fe_3O_4$, an oxide of the form $ABO_3$-perovskite, and combinations thereof.

6. The method of claim 1, wherein the bi-stable resistive system comprises a threshold-switching selector.

7. The method of claim 6, wherein the threshold-switching selector comprises Ag-doped $HfO_2$, Cu/$HfO_2$, Ag/$TiO_2$, $CU_xS$, Ag/a-Si, AgTe/TiN/$TiO_2$/TiN, W/$Cu_xS$, and combinations thereof.

8. The method of claim 1, wherein the bi-stable resistive system comprises a unipolar, abrupt, reversible, and electrically triggered resistance switch between two stable resistance states.

* * * * *